(12) United States Patent
Filella et al.

(10) Patent No.: US 10,865,056 B2
(45) Date of Patent: Dec. 15, 2020

(54) INCLINED AIR CONVEYOR DESTACKING APPARATUS

(71) Applicant: FIVES INTRALOGISTICS S.P.A. CON SOCIO UNICO, Lonate Pozzolo (IT)

(72) Inventors: Carmine Filella, Cavaria Con Premezzo (IT); Marco Castelli, Nerviano (IT)

(73) Assignee: FIVES INTRALOGISTICS S.P.A. CON SOCIO UNICO, Lonate Pozzolo (IT)

( * ) Notice: Subject to any disclaimer, the term of this patent is extended or adjusted under 35 U.S.C. 154(b) by 0 days.

(21) Appl. No.: 16/514,603

(22) Filed: Jul. 17, 2019

(65) Prior Publication Data

US 2020/0031595 A1 Jan. 30, 2020

(30) Foreign Application Priority Data

Jul. 30, 2018 (IT) .......................... 102018000007630

(51) Int. Cl.
*B65G 59/06* (2006.01)
*B65G 49/06* (2006.01)
*B65H 3/12* (2006.01)
*H01L 21/677* (2006.01)

(52) U.S. Cl.
CPC ......... *B65G 59/062* (2013.01); *B65G 49/065* (2013.01); *B65G 59/06* (2013.01); *B65H 3/126* (2013.01); *B65G 2203/041* (2013.01); *H01L 21/67784* (2013.01)

(58) Field of Classification Search
CPC ...... B65G 15/58; B65G 59/062; B65G 59/12; B65G 43/08; B65G 47/30; B65G 59/06; B65G 59/08; B07C 1/04
See application file for complete search history.

(56) References Cited

U.S. PATENT DOCUMENTS

| 3,291,282 | A |   | 12/1966 | Pedagno |           |
|-----------|---|---|---------|---------|-----------|
| 4,236,708 | A | * | 12/1980 | Matsuo  | B65H 3/126 |
|           |   |   |         |         | 271/12    |
| 4,359,214 | A | * | 11/1982 | Eldridge | B65H 3/126 |
|           |   |   |         |         | 271/104   |
| 5,074,539 | A | * | 12/1991 | Wells   | B65H 3/042 |
|           |   |   |         |         | 271/12    |
| 5,465,825 | A | * | 11/1995 | Levaro  | B07C 1/04 |
|           |   |   |         |         | 198/444   |
| 6,491,154 | B2 | * | 12/2002 | Ydoate  | B65G 47/31 |
|           |   |   |         |         | 198/444   |
| 6,918,588 | B2 | * | 7/2005  | Muller  | B65H 5/224 |
|           |   |   |         |         | 198/459.1 |

(Continued)

FOREIGN PATENT DOCUMENTS

DE 102013212423 12/2014
JP H08169553 A 7/1996

*Primary Examiner* — Gregory W Adams
(74) *Attorney, Agent, or Firm* — Pearne & Gordon LLP

(57) ABSTRACT

The destacker apparatus (1), comprises: a succession of conveyors (10, 11, 12) arranged inclined relative to the horizon, each comprising a mobile surface (S) for receiving and supporting articles (J, K) carried upwards by the conveyors (10, 11, 12); and a device for varying the pressure of a fluid (2).
The surface (S) of the conveyors (10, 11, 12) has through holes and the pressure varying device (2) is fluid dynamically connected to this surface (S).

17 Claims, 3 Drawing Sheets

(56) References Cited

U.S. PATENT DOCUMENTS

| | | | | |
|---|---|---|---|---|
| 7,731,186 | B2 * | 6/2010 | Krause | B41F 21/08 |
| | | | | 271/193 |
| 8,033,158 | B2 * | 10/2011 | Strohmeyer | B07C 1/00 |
| | | | | 209/606 |
| 9,051,138 | B2 * | 6/2015 | Clevers | B65H 5/224 |
| 9,498,798 | B2 * | 11/2016 | Hellenbrand | B07C 5/362 |
| 9,776,796 | B2 | 10/2017 | Tanz | |
| 2015/0158672 | A1 | 6/2015 | Lenser et al. | |
| 2016/0280464 | A1 | 9/2016 | Tanz | |

\* cited by examiner

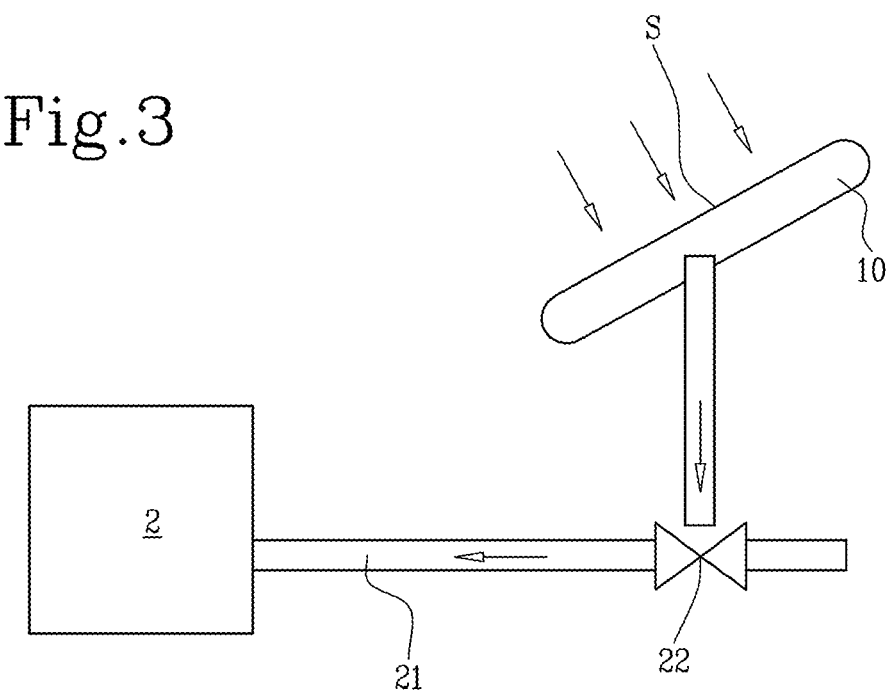
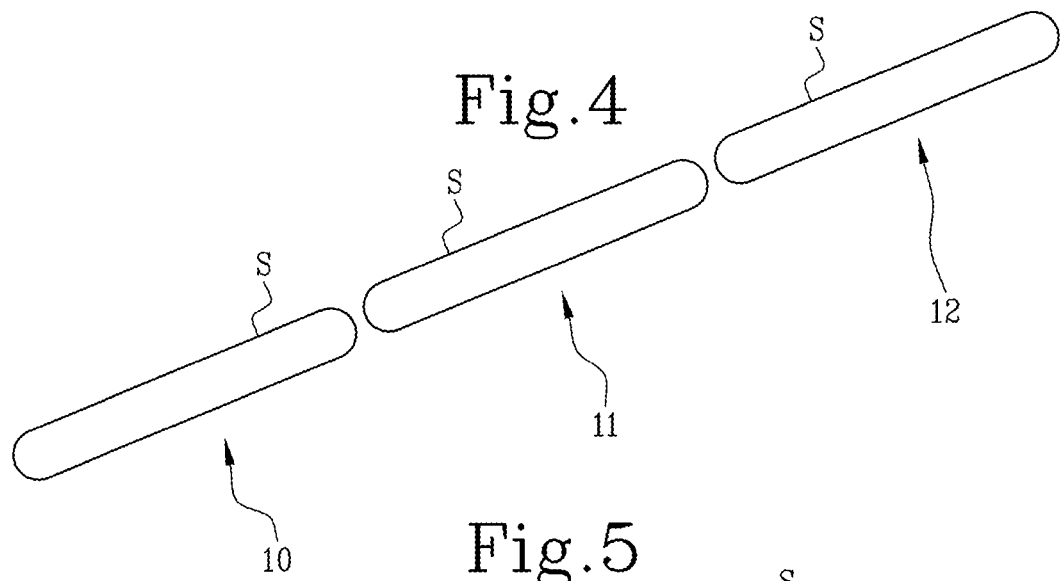
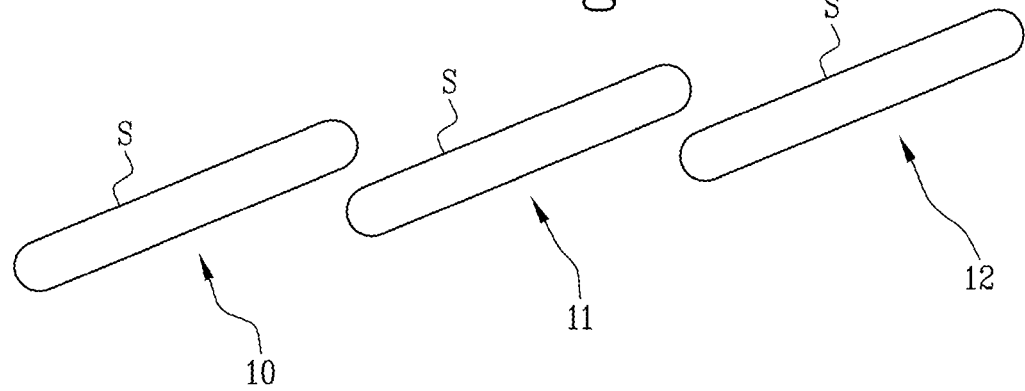

INCLINED AIR CONVEYOR DESTACKING APPARATUS

DESCRIPTION

The present invention relates to a perfected destacker apparatus, especially intended for use in sorter systems for leaflets, envelopes, parcels or other articles.

Destackers are known which are constituted by a series of inclined motorised belts, to define a sort of ramp, at the base of which stacks or piles of articles are fed, which are gripped and carried upwards from the first belt of the series.

The destacking is performed by exploiting the force of gravity, allowing the groups of articles that are carried upwards to separate when one or more of them slides downwards and exploiting variable speeds or accelerations between two subsequent belts, so that different movement conditions are created between different articles that can promote their separation.

These known systems operate with a certain efficacy in destacking parcels or other articles that are not very light, but are much less effective when used to separate leaflets or similar.

In this context, the technical task underpinning the present invention is to propose a destacker apparatus able to overcome the drawbacks of the cited prior art.

The technical task is reached by the machine realised in accordance with claim 1.

Further characteristics and advantages of the present invention will become more apparent from the approximate and thus non-limiting description of a preferred, but not exclusive, embodiment of an apparatus of the invention, as illustrated in the accompanying drawings, in which:

FIG. 3 is a schematic view of the apparatus of the preceding claim, in which an adjustment valve is shown;

FIGS. 4 and 5 are schematic views showing possible configurations of the conveyors of the proposed apparatus.

Figure 1:
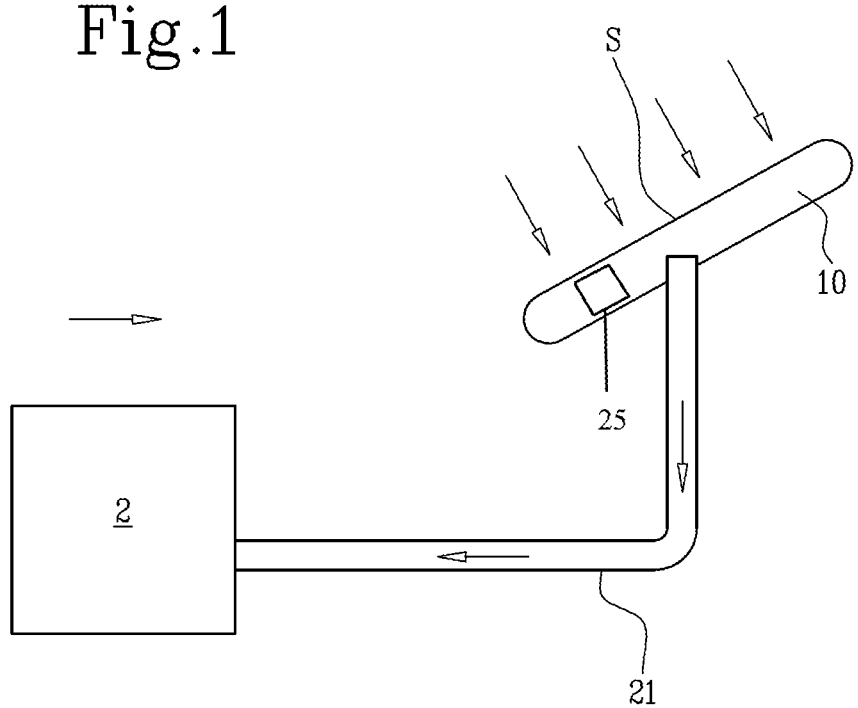
FIGS. 1 and 2 are schematic views of the apparatus of the invention, showing two modes of operation.

With reference to the above-mentioned figures, reference number 1 indicates a destacker apparatus realised according to the invention.

The proposed apparatus 1 firstly comprises a succession of conveyors 10, 11, 12, arranged inclined relative to the horizon, to define a ramp, each comprising a mobile surface S, preferably flat, for receiving and supporting articles K, J that are carried upwards.

In practice, the conveyors are arranged at increasing heights, preferably with the same inclination, to define an upwards transport path; for example, three conveyors 10, 11, 12 can be provided.

These articles, for example leaflets, but also parcels, envelopes or others, are transported from the bottom of the apparatus 1 towards the top, through subsequent delivery passages between the various conveyors 10, 11, 12.

The output of the apparatus 1 is at the top of the ramp 10, 11, 12, through which the articles are delivered to the other stations of the system.

Preferably, the conveyors 10, 11, 12 each include a belt closed in a loop around end drives, at least one of which is motorised; the belt 10, 11, 12 is equipped with a contact surface S defined by the upper ramp of the belt itself.

According to one possible configuration of the ramp 10, 11, 12, the contact surfaces S of the conveyors 10, 11, 12 are arranged substantially on a same plane (see FIG. 4), while according to a different configuration, the conveyors 10, 11, 12 are mutually arranged in pairs in such a way that the downstream end of the conveyors further upstream is higher than and overlapping the upstream end of the conveyor further downstream (see FIG. 5).

According to an important aspect of the invention, the apparatus 1 includes a pressure varying device 2 and the contact surface S of the conveyors 10, 11, 12 has through holes which are designed to be placed in fluid communication with this pressure varying device 2.

In detail, the pressure varying device 2 can include both a negative pressure source and an overpressure source, which can possibly coincide and be defined by a compressor/aspirator, for example, equipped with an impeller or other devices known on the market.

Thanks to this expedient, the adherence of certain articles can be increased by creating a negative pressure at the contact surface S (see the arrows in FIGS. 1 and 3), or the adherence of certain articles can be decreased by creating an overpressure at the surface S (see for example FIG. 2), to make it possible, in cooperation with the force of gravity, to more effectively separate the stacked or piled articles.

Figure 6:
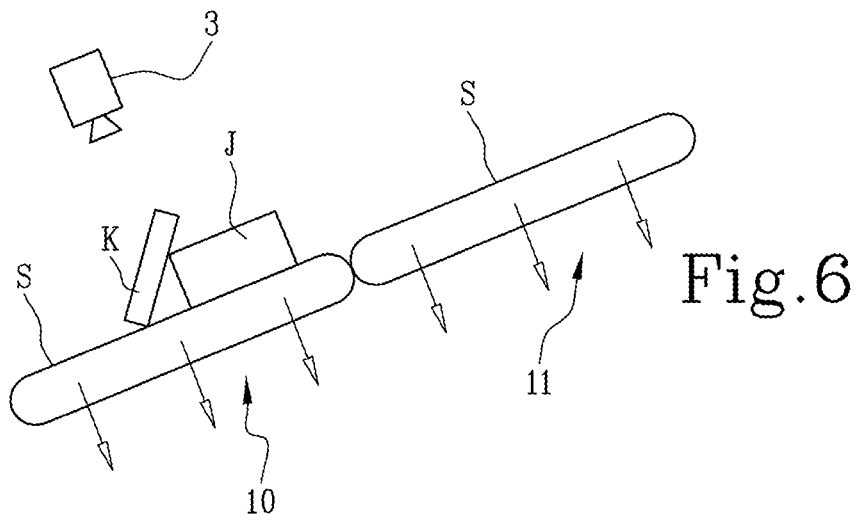
FIGS. 6-8 are schematic views showing a sequence of operation of the invention.
Figure 7:
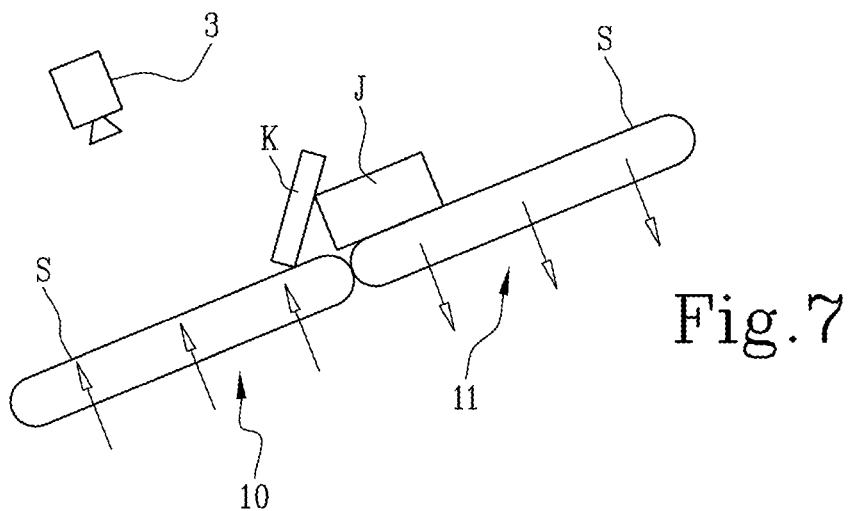

For example, the adherence of a belt 11 (or another conveyor) which receives an article J from the adjacent belt 10 placed upstream can be increased, to define a gradient of adherence between it and the other articles K of the stack, to favour the unstacking or destacking (see FIGS. 6 and 7).

Conversely, the adherence of the belt upstream 10 can be decreased during the transfer of one or more articles J on a belt downstream 11, so that the force of gravity favours the downstream sliding, separating the pile.

The two modes of use described in the preceding paragraphs can be used together or in a selective manner; moreover, further modes of use will be illustrated in the description of the operation of the invention.

Holes can be formed on a majority portion of the mobile contact surface S and, preferably, they are distributed in a uniform manner.

Preferably, inside the conveyor belts 10, 11, 12, a perforated box-shaped element 25 is placed which is designed to communicate fluid dynamically with the pressure varying device 2.

Figure 2:
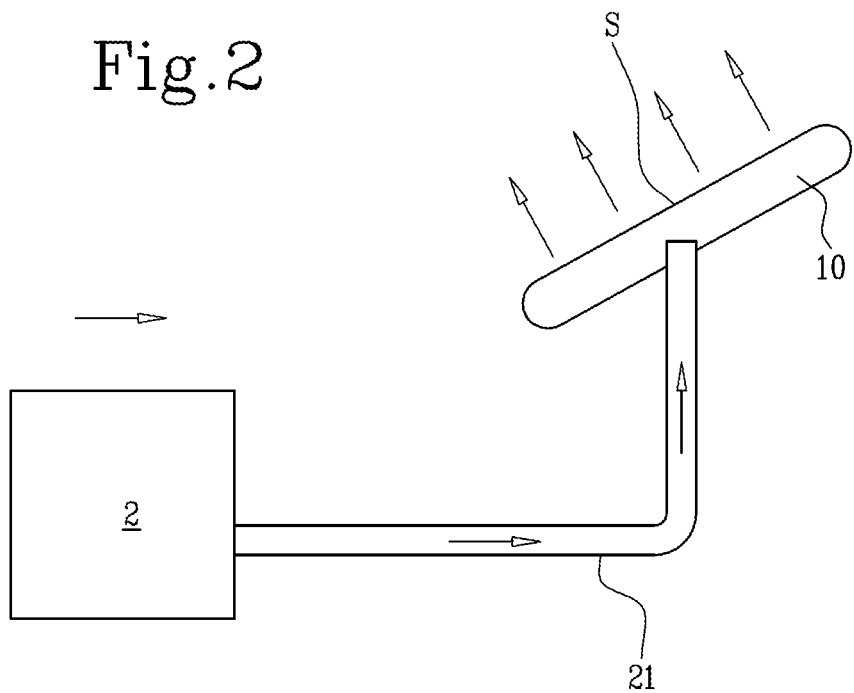

Even more in detail, between the pressure varying device 2 and the interior of the conveyors 10, 11, 12, communication ducts 21 can be provided, preferably with the interposition of valves 22 to adjust the fluid communication (see FIGS. 1-3).

For example, it is possible to select the conveyors 10, 11, 12 affected by the pressure variation, providing a respective adjustment valve 22 for each of them.

According to an important aspect of the invention, the apparatus 1 comprises one or more acquisition devices 3, designed to detect the arrangement of the articles J, K moved on one or more of the conveyors 10, 11, 12.

Each acquisition device 3, which can for example comprise a camera, is designed to produce arrangement signals that depend on the acquired configuration of the articles.

Furthermore, the apparatus 1 includes a processing unit, connected to the acquisition device 3 and configured to control the operation of the pressure varying device 2 based on the above-mentioned arrangement signals.

In practice, based on the fact that the camera 3 (or other device designed for the purpose) detects individual or stacked articles, the aspirator/compressor 2 is consequently activated or deactivated or the above-mentioned valves 3 are opened or closed, which are subject to the processing unit.

Figure 8:
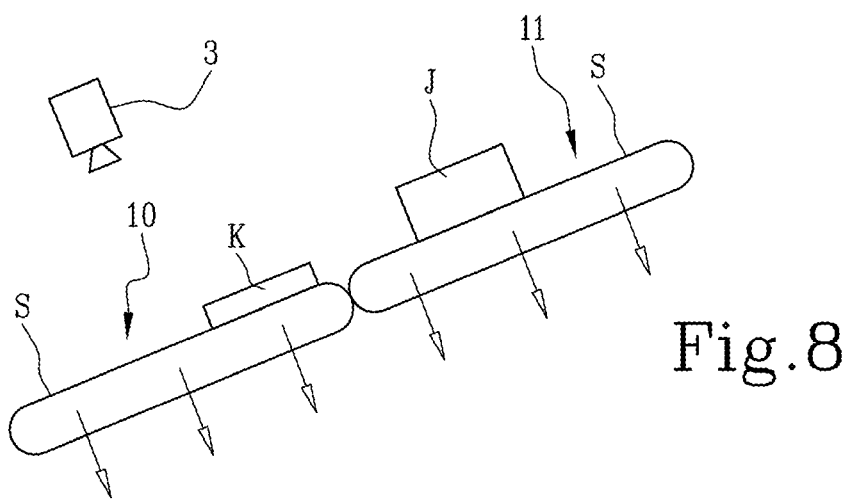

For example, as shown in FIGS. 6-8, if the camera 3 detects a group of two stacked articles J, K, the processing unit can control an aspiration on the contact surface S of the belt 11 further downstream, i.e. the one which is higher, which with the aid of the force of gravity, produces a separation of the two articles J, K, especially if the contact surface S of the belt further upstream 10 is air blown.

Once the separation has been performed, the adherence on both belts 10, 11 can be increased through aspiration, so that the products J, K do not slip downwards.

According to a particular embodiment of the invention, at the contact surface S of each conveyors 10, 11, 12 a conveying surface is defined along which the articles are moved, which is divided into a plurality of operating areas designed to be selectively positioned in fluid communication with the pressure varying device 2.

In practice, multiple zones or quadrants are identified on the upper branch of the belt 10, 11, 12 (or another conveyor) that can suck/blow independently from each other.

For example, two or more perforated box-shaped elements can be provided inside the belt 10, 11, 12 or the perforated box-shaped structure can be internally compartmentalised by dividers.

In any case, each operational area can be connected to the aspirator/compressor 2 with the interposition of a respective valve 22 controlled by the processing unit.

In detail, the processing unit comprises a position module configured to determine the relative position of the articles on the conveyor surface, as a function of the arrangement signals received from the camera 3 and also comprises a selection module configured in such a way as to select which of said operating areas is put in communication with the pressure varying device 2.

In other words, the processing unit, based on the position of the articles J, K on the belt 10, 11, 12, can decide to produce a variation of the surface pressure at a specific area, for example to increase adherence of a specific article placed at the same area and can decrease that of another article stacked on the first, so as to cause the separation thereof.

The invention, in its general aspects, operates as described below.

The proposed apparatus 1 is fed with loose articles, stacked or piled, at the bottom of the ramp.

The first belt 10 carries the products J, K upwards, which begin to be subject to the force of gravity.

Particularly at the transition zones of the belts 10, 11, 12, an adherence differential is produced, according to the already explained methodologies, so as to separate or otherwise scatter the overlapping articles.

This operation is repeated several times, in order to have a destacking of the articles so as to eliminate mutual overlapping.

It can thus be understood how the invention is capable of effectively destacking also leaflets or other very light articles, thus overcoming the limitations of the prior art.

The invention claimed is:

1. A destacker apparatus (1), comprising:
a succession of conveyors (10, 11, 12) arranged inclined relative to the horizon, each comprising an inclined mobile surface (S) for receiving and supporting articles (J, K) carried upwards by the conveyors (10, 11, 12); and
at least one device for varying the pressure of a fluid (2); wherein the mobile surface (S) of a first one of the conveyors (10, 11, 12) is a first mobile surface (S) and has through holes and wherein the pressure varying device (2) is fluid dynamically connectable to said first mobile surface (S) and is effective (a) to provide sufficient negative pressure to prevent some of said articles (J, K) from sliding backward down the first mobile surface (S) and (b) to provide negative pressure to a plurality of said articles (J, K) simultaneously.

2. The apparatus (1) according to claim 1, wherein the holes are distributed on a majority portion of the first mobile surface (S).

3. The apparatus according to claim 1, wherein each of the conveyors (10, 11, 12) comprises a conveyor belt closed in a loop and provided with a contact surface (S) defined by an upper ramp of the belt.

4. The apparatus (1) according to claim 3, wherein said first one of the conveyors (10, 11, 12) comprises a perforated box-shaped element effective to communicate fluid dynamically with the pressure varying device (2).

5. The apparatus (1) according to claim 4, wherein said first one of the conveyors (10, 11, 12) comprises a plurality of perforated box-shaped elements that are operable to suck or blow independently from each other.

6. The apparatus (1) according to claim 3, wherein the contact surfaces (S) of two or more conveyors (10, 11, 12) are positioned substantially on a same plane.

7. The apparatus (1) according to claim 1, wherein at least one pair of conveyors (10, 11, 12) is mutually positioned in such a way that the downstream end of the conveyor further upstream is higher than the upstream end of the conveyor downstream.

8. The apparatus (1) according to claim 7, wherein said downstream end overlaps said upstream end.

9. The apparatus (1) according to claim 1, wherein the pressure varying device (2) is also effective to produce an overpressure.

10. The apparatus (1) according to claim 1, comprising:
at least one acquisition device (3) designed to detect the arrangement of the articles (J, K) moved on at least one conveyor (10, 11, 12) and to produce arrangement signals; and
at least one processing unit connected to the acquisition device (3) and configured to control the operation of the pressure varying device (2) according to the arrangement signals.

11. The apparatus (1) according to claim 10, wherein said first one of the conveyors (10, 11, 12) comprises a contact surface (S) that defines a conveying surface along which the articles are moved, said contact surface being divided into a plurality of operating areas designed to be selectively positioned in fluid communication with the pressure varying device (2), the processing unit comprising a position module for determining the relative position of the articles (J, K) on the contact surface, as a function of the arrangement signals. and a selection module configured in such a way as to select which of the operating areas is put in fluid communication with the pressure varying device (2), as a function of the position signals.

12. The apparatus (1) according to claim 1, wherein said articles (J, K) comprise a first article and a second article, the first article being dissimilar to the second article.

13. The apparatus (1) according to claim 1, wherein the mobile surface (S) of each of three adjacent conveyors (10, 11, 12) has through holes.

14. The apparatus (1) according to claim 1, wherein said first one of the conveyors comprises a conveyor belt, wherein an upper branch of the belt has multiple zones that are operable to suck or blow independently from each other.

15. The apparatus (1) according to claim 1, wherein two of said conveyors are adjacent to each other in succession and are fluid dynamically connectable to the pressure varying device (2) and each has a mobile surface (S) having through holes; the apparatus (1) being effective to produce a negative pressure in one of said two adjacent conveyors and simultaneously produce an overpressure in the other of said two adjacent conveyors.

16. The apparatus (1) according to claim 15, wherein the overpressure in produced in the conveyor which is upstream of the other conveyor.

17. The apparatus (1) according to claim 1, wherein the pressure varying device (2) is effective to provide a negative pressure from a first end of said first one of the conveyors (10, 11, 12) to a second end of said first one of the conveyors (10, 11, 12).

\* \* \* \* \*